US012787197B1

(12) United States Patent
Ko

(10) Patent No.: US 12,787,197 B1
(45) Date of Patent: Nov. 3, 2026

(54) BATTERY POWERED SMART WALL PLATE

(71) Applicant: Lawrence Ko, San Jose, CA (US)

(72) Inventor: Lawrence Ko, San Jose, CA (US)

(*) Notice: Subject to any disclaimer, the term of this patent is extended or adjusted under 35 U.S.C. 154(b) by 433 days.

(21) Appl. No.: 18/536,015

(22) Filed: Dec. 11, 2023

Related U.S. Application Data

(63) Continuation-in-part of application No. 18/128,670, filed on Mar. 30, 2023, now Pat. No. 11,916,330, and a continuation-in-part of application No. 17/709,246, filed on Mar. 30, 2022, now abandoned.

(51) Int. Cl.
*H05K 7/10* (2006.01)
*H01R 13/70* (2006.01)
*H05K 7/14* (2006.01)

(52) U.S. Cl.
CPC ......... *H05K 7/1092* (2013.01); *H01R 13/701* (2013.01); *H05K 7/1428* (2013.01)

(58) Field of Classification Search
None
See application file for complete search history.

(56) References Cited

U.S. PATENT DOCUMENTS 11,509,102 B1 * 11/2022 Baldwin ................ H01R 24/78
12,244,129 B2 * 3/2025 Shurte .................. H05K 7/1427

* cited by examiner

*Primary Examiner* — Ross N Gushi
(74) *Attorney, Agent, or Firm* — Plager Schack LLP; Mark H. Plager; Naomi Mann

(57) ABSTRACT

Disclosed is a smart device system providing a battery powered wall plate. In certain embodiments, the wall plate may comprise a front enclosure; and a PCB module, wherein the smart wall plate is configured to retain a battery for powering the PCB module, and wherein the smart wall plate is configured to framingly mount around a gang unit of an in-wall electrical box or the in-wall unit, the smart wall plate including an opening through which the gang unit is exposed.

11 Claims, 7 Drawing Sheets

BATTERY POWERED SMART WALL PLATE

RELATED APPLICATIONS

This application is a continuation-in-part of U.S. application Ser. No. 17/709,246 filed Mar. 30, 2022, and of Ser. No. 18/128,670 filed Mar. 30, 2023, both of which are incorporated by reference herein in their entirety.

BACKGROUND

The present disclosure relates generally to wall plates and smart control devices and systems.

A smart control setup for a residence, commercial building, or other establishment, may comprise smart accessories provided at various locations. In certain cases, the accessory lacks a secure position, and may be moved around or fall overtime. In other cases, the smart accessory may be installed into an outlet receptacle. This, however, reduces the available outlet receptacles which may otherwise be used/needed for other appliances. A further method may comprise replacing the entire electrical box (e.g., outlet, light switch, dimmer, etc.) with one that is capable of smart accessory features. This may require a technician, as handling AC lines may be complex and hazardous for a layperson. As such, an improved system is desirable.

SUMMARY

According to various embodiments, disclosed is a smart device system providing a battery powered wall plate. In certain embodiments, the wall plate may comprise a front enclosure; and a PCB module, wherein the smart wall plate is configured to retain a battery for powering the PCB module, and wherein the smart wall plate is configured to framingly mount around a gang unit of an in-wall electrical box or the in-wall unit, the smart wall plate including an opening through which the gang unit is exposed. In certain embodiments, the smart wall plate may further comprise a rear enclosure, wherein the PCB module is disposed between the front enclosure and the rear enclosure. In some embodiments, the front enclosure includes holes for receiving fasteners configured to attach the smart wall plate to a wall surrounding the in-wall electrical box or the in-wall unit. It should be noted that in alternate embodiments, the front enclosure may not require fixture screw holes, in which case the fixture holes may be provided by an intermediate cover plate to which the rear enclosure is attached. In certain embodiments, the smart wall plate may further comprise a battery holder attached to a printed circuit board of the PCB module. In some embodiments, the battery holder is configured to retain a disk battery. In certain embodiments, the smart wall plate may further comprise a rechargeable battery attached to a printed circuit board of the PCB module, the rechargeable battery including a charging port. In some embodiments, the charging port includes a magnetic housing. In some embodiments, the charging port is exposed through a slot within an outer side wall of the front enclosure. In certain embodiments, the smart wall plate may further comprise a rear enclosure, wherein the printed circuit board module is disposed between the front enclosure and the rear enclosure, and wherein the charging port is exposed through a slot within the rear enclosure. In certain embodiments, the smart wall plate may further comprise a rechargeable battery attached to a printed circuit board of the PCB module, the rechargeable battery including a wireless charging area, without the charging port exposed through a slot either within the front closure or rear closure. In some embodiments, the smart wall plate is configured to replace an existing wall plate of the in-wall electrical box, the electrical box including one or more gangs.

BRIEF DESCRIPTION OF THE FIGURES

The detailed description of some embodiments of the invention will be made below with reference to the accompanying figures, wherein the figures disclose one or more embodiments of the present invention.

DETAILED DESCRIPTION OF CERTAIN EMBODIMENTS

Figure 1:
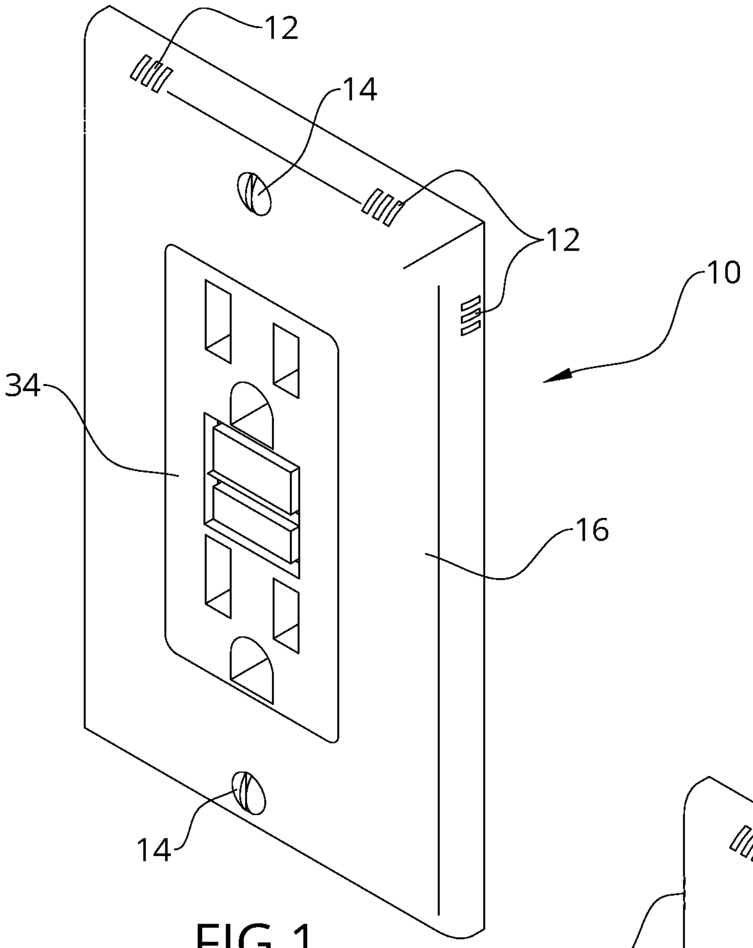
FIG. 1 is a perspective view of a battery powered smart wall plate shown combined with an electrical outlet.
Figure 2:
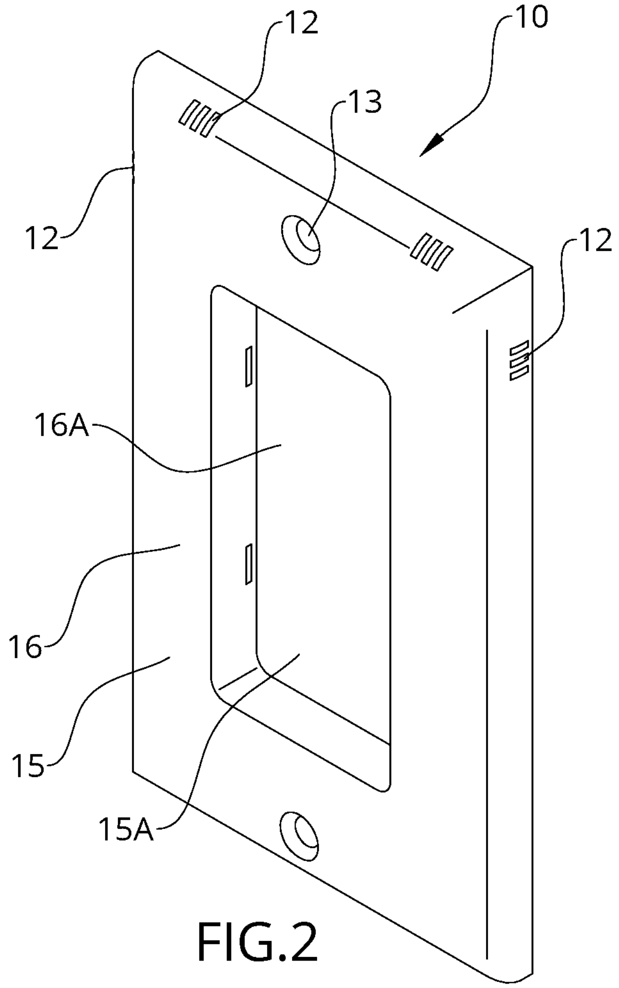
FIG. 2 is a front perspective view of the smart wall plate of FIG. 1, shown without the electrical outlet.

According to various embodiments as depicted in FIGS. 1-10, the disclosed subject matter provides a smart device system comprising a battery powered smart wall plate 10. In embodiments, smart wall plate 10 provides a fixture which may be attached to a wall via attachment components such as screws, nails, adhesive, etc. In certain embodiments, smart wall plate 10 is configured to frame around the external interface components (i.e., gangs or gang units) of an in-wall electrical box or an in-wall unit. In some further embodiments, smart wall plate 10 may be attached via attachment elements, e.g., attachment screws 14 of the existing electrical box, but not necessarily so. The disclosed system provides smart devices in a home, office, commercial establishment, or other space while avoiding clutter, and does not require an empty receptacle or replacement/modification of an existing electrical box.

In certain embodiments, smart wall plate 10 may be installed to aesthetically combine with any in-wall electrical box such as a typical outlet (GFCI receptacle 34), light switch 36, dimmer, phone box, ethernet box, etc. As such, smart wall plate 10 may replace a regular (i.e., non-electrically functional wall plate) to provide smart functionality in a building or other space, wherein the functionality of smart wall plate 10 may be unrelated to the functionality of the electrical box and/or the in-wall unit itself. However, in other embodiments, the in-wall unit inside the electrical box may support smart functionality and may further be configured to pair and/or communicate remotely with smart wall plate 10, wherein the battery powered feature provides for easy replacement and installation. It shall be appreciated that smart wall plate 10 may support various functionalities which are known or may become available with emerging technology. Such functionalities include, but are not limited to a smart temperature and humidity sensor, smart motion sensor, smart occupancy sensor, smart ambient brightness sensor, smart air quality sensor, smart camera, smart voice assistant with speaker and microphone attached, smart theme/routine selectors, smart lights, and/or smart dimmable lights, etc.

In embodiments, smart wall plate 10 may generally comprise a front enclosure 10A, a printed circuit board module 10B ("PCB module 10B"), and a rear enclosure 10C. Smart wall plate 10 is further configured to retain at least one battery 11 in electrical contact with PCB module 10B. In certain embodiments, front enclosure 10A, PCB module 10B, and rear enclosure 10C may be configured to frame the external interface components or gang units of an electrical box. In further embodiments, PCB module 10B may be retained between front enclosure 10A and rear enclosure 10C. In some further embodiments, battery 11 may be coupled to PCB module 10B.

In certain embodiments, front enclosure 10A may include a front face plate 15 comprising one or more opening(s) 15A of various sizes for framing the external components of an electrical box of a specific design and/or functionality. In one example, front enclosure 10A may be a single gang outlet front enclosure 16 including a central opening 16A configured to frame a GFCI receptacle 34 or rocker light switch 36 (see FIGS. 1-5, and 8-10). In another example, front enclosure 10A may be a single gang toggle front enclosure 28 configured to frame a toggle light switch 38 (see FIG. 6). In another example, front enclosure 10A may be a multi-gang front enclosure 32 (e.g., two gang, three gang, etc.) configured to frame various multi-gang boxes (see FIG. 7), and the like.

In certain embodiments, front enclosure 10A may comprise auxiliary element(s) such as one or more ventilation hole(s) 12, illumination slot(s) 24, and the like. In further embodiments, front enclosure 10A may be configured to attach smart wall plate 10 to a wall surrounding the electrical box and/or to the electrical box yoke and/or to the in-wall unit. According to an exemplary embodiment, front enclosure 10A may comprise opening(s) 13 for receiving attachment screws 14 or other fasteners. It shall be appreciated that any suitable attachment elements, e.g., nails, adhesive, cement, etc. may be used in alternate embodiments. It shall be appreciated that the size, shape, and style of front enclosure 10A may be adapted to the shape, size, and style of different electrical boxes including designs available in different countries of the world according to alternate embodiments. Additionally, the design of front enclosure 10A may be adapted to the functionality of smart wall plate 10 and may include various elements that support said functionality in alternate embodiments.

Figure 7:
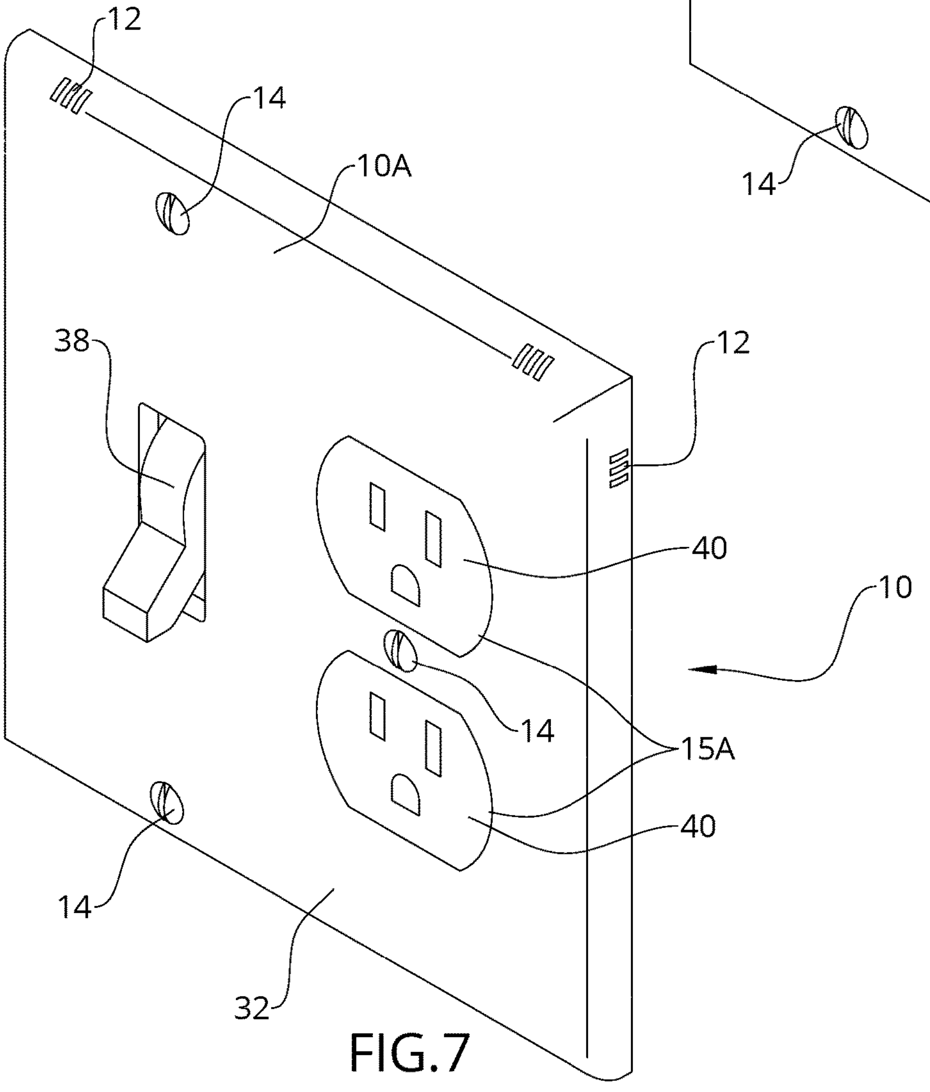
FIG. 7 is perspective view of a battery powered smart wall plate configured for a multi-gang outlet/switch system according to an alternate embodiment, the wall plate being shown installed.

In embodiments, PCB module 10B may generally comprise a printed circuit board (PCB) with microcontroller configured to effectuate the functionality of smart wall plate 10, and an antenna that provides wireless communication capability. PCB module 10B may further be configured to hold battery 11. In certain embodiments, PCB module 10B may be retained between front enclosure 10A and rear enclosure 10C. In certain embodiments, PCB module 10B and rear enclosure 10C are shaped correspondingly to front enclosure 10A and include one or more openings 15A of various sizes for framing the gang units of an electrical box. For example, PCB 10B and rear enclosure 10C may have a single gang outlet design corresponding to front enclosure 16 as depicted in FIGS. 1-5 and 8-10; or a single gang toggle design corresponding to front enclosure 28; or a multi-gang design corresponding to front enclosure 32 as depicted in FIG. 7. It shall be appreciated that different designs and sizes will be employed in alternate embodiments depending on the electrical box for which smart wall plate 10 is designed to accommodate.

In some embodiments, front enclosure 10A may comprise a rear-side well 17 configured to receive or encapsulate PCB module 10B, and/or rear enclosure 10C. In embodiments, rear-side well 17 may be formed between outer surrounding wall(s) 17A extending rearwardly from an outer perimeter of front face plate 15 and inner surrounding wall(s) 17B extending rearwardly from an inner perimeter of front face plate 15. In some embodiments, outer and/or inner surrounding wall(s) 17A, 17B ("side wall(s)") may incorporate ventilation hole(s) 12, illumination slot(s) 24, and/or other auxiliary elements of smart wall plate 10. In one embodiment, front enclosure 10A may include pegs 19 configured to engage correspondingly positioned slots 19A and 19B within PCB module 10B and rear enclosure 10C, respectively. In further embodiments, PCB 10B and rear enclosure 10C include openings and/or cut outs 13A corresponding to openings 13 in front enclosure 10A. Openings/cut outs 13A are configured to allow attachment screws 14 to pass through for attachment of smart wall plate 10 to a wall surrounding the electrical box, said attachment screws 14 being engaged through openings 13 in front enclosure 10A.

It shall be appreciated that in alternate embodiments, smart wall plate 10 may be installed to a surface not surrounding an electrical box (i.e., as an independently mounted unit); to this end, front face plate 15/front enclosure 10A, PCB module 10B, and/or rear enclosure 10C may be designed without any openings 15A depending on factors such as design preference and/or system needs.

Figure 3:
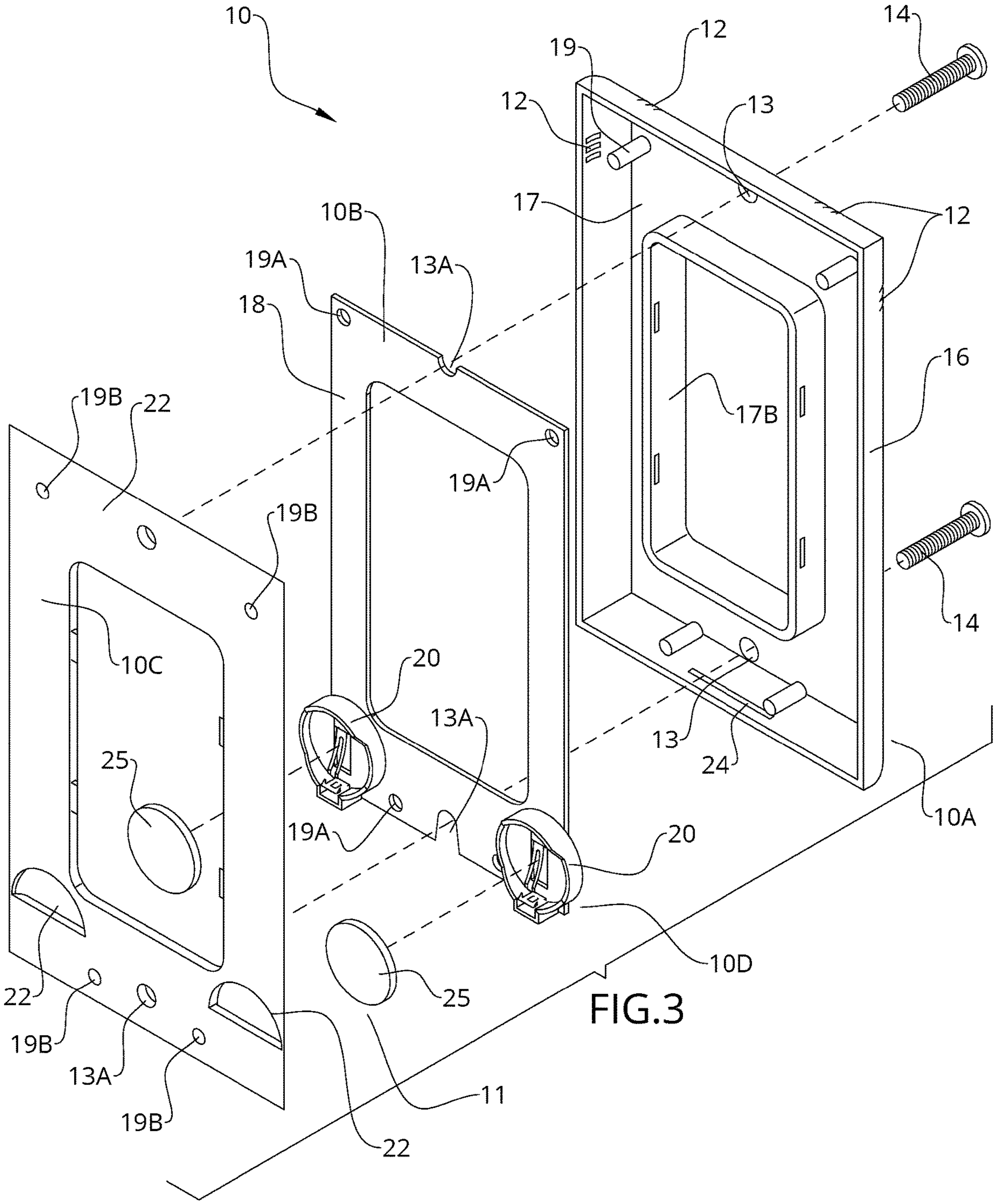
FIG. 3 is a rear perspective exploded view of the smart wall plate.
Figure 4:
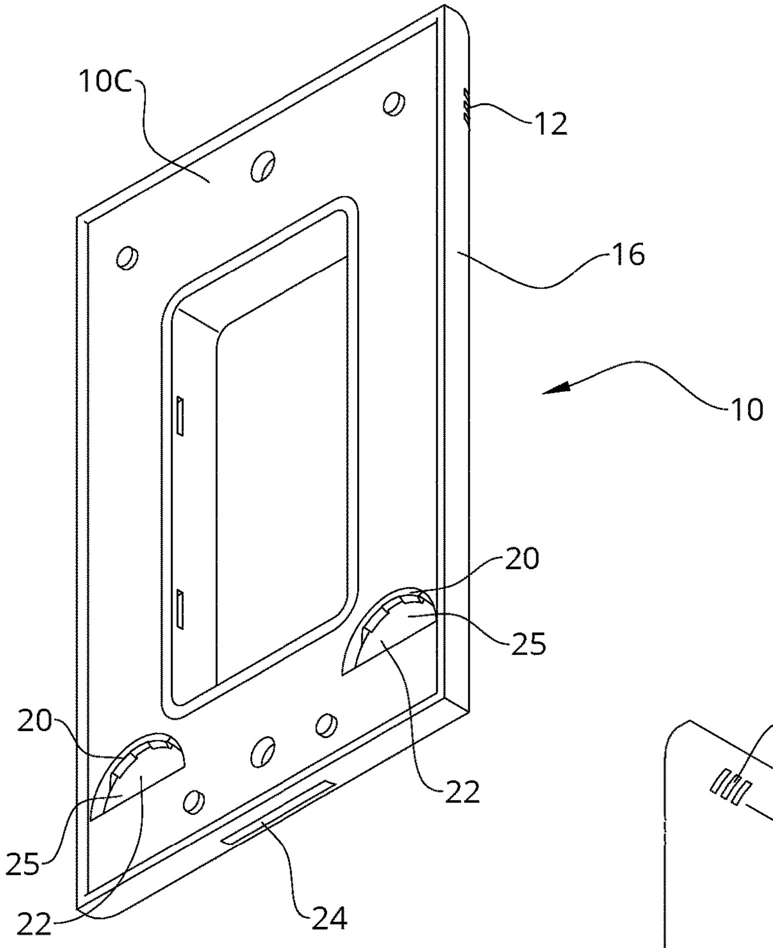
FIG. 4 is a rear perspective view of the smart wall plate.
Figure 5:
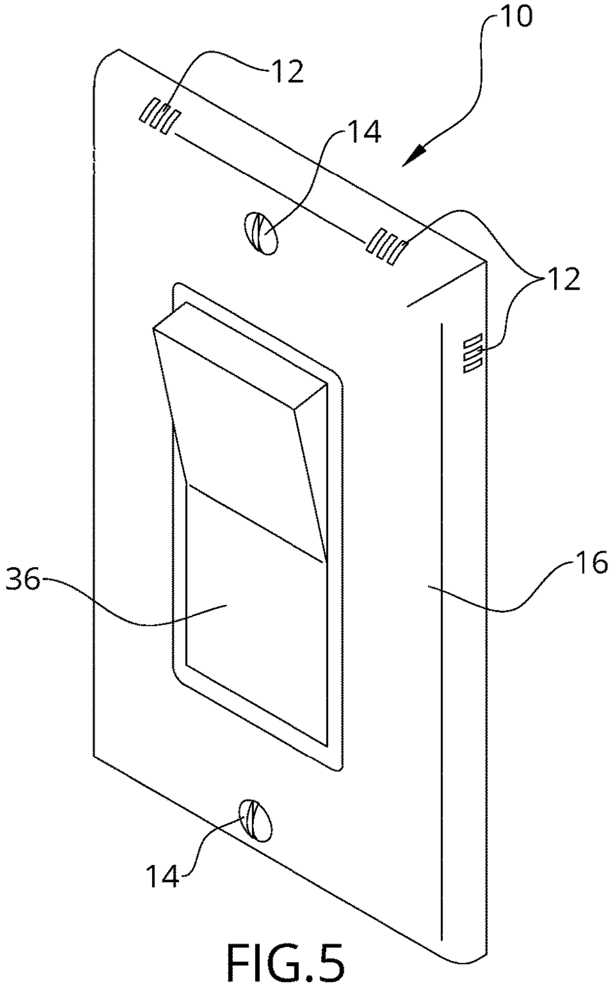
FIG. 5 is a front perspective view of the smart wall plate shown in combination with a switch.
Figure 6:
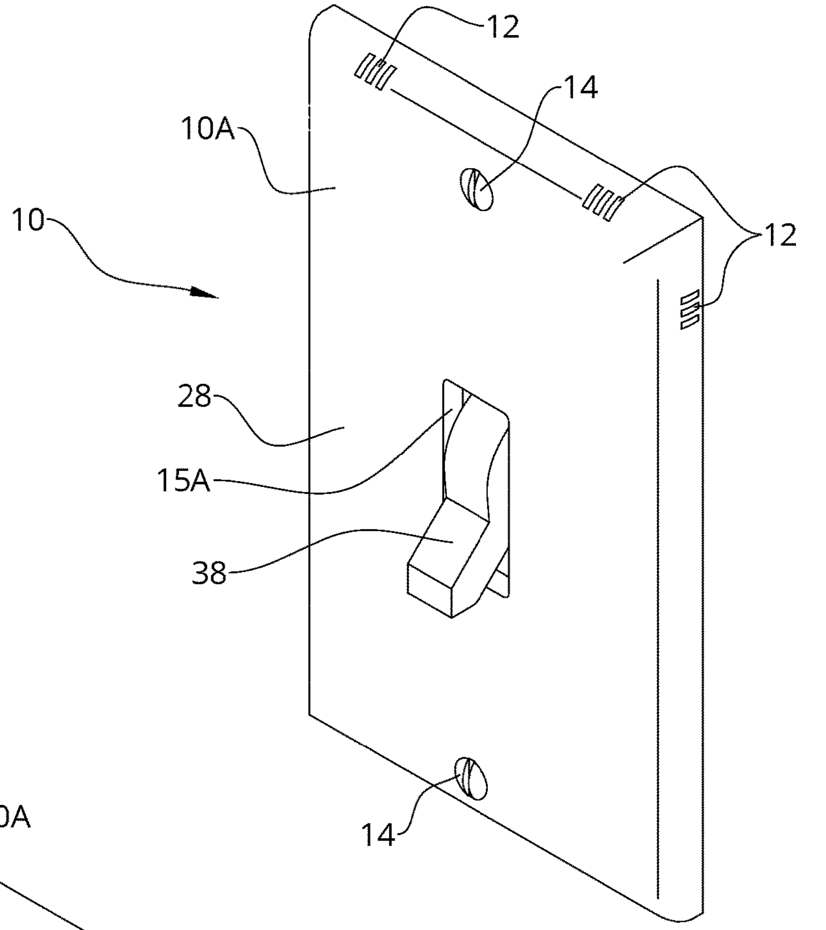
FIG. 6 is perspective view of a battery powered smart wall plate configured for a different style switch (i.e., toggle) according to an alternate embodiment, the wall plate being shown combined with the switch.

In certain embodiments as best depicted in FIGS. 3 and 4, PCB module 10B may be configured to hold disc batteries 25 (also known as button cells). In one embodiment, PCB module 10 may comprise a PCB 18 supporting two battery holders 20 on right and left bottom rear sides of PCB 18, each of battery holders 20 configured to house one of disc batteries 25 for powering smart wall plate 10. In some further embodiments, rear enclosure 10C may include battery access slots 22 through which batteries 25 may be removed and installed, but not necessarily so.

Figure 8:
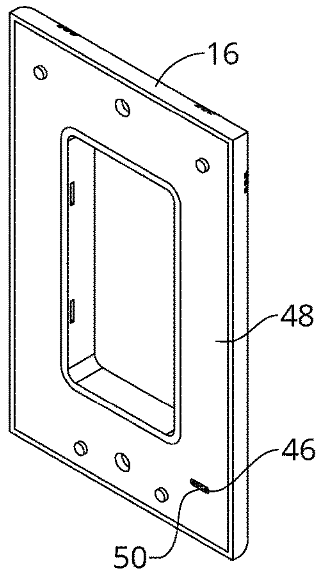
FIG. 8 is a rear-side perspective view of a battery powered smart wall plate including rechargeable batteries and a charger port, according to an alternate embodiment.
Figure 9:
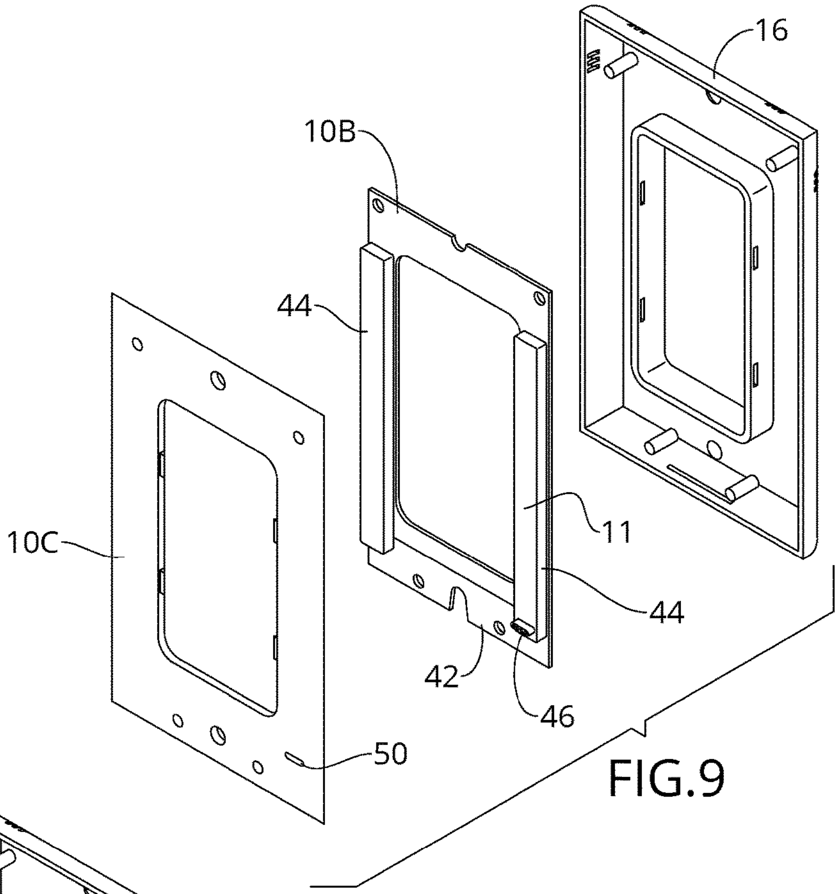
FIG. 9 is a rear perspective exploded view of the smart wall plate of FIG. 8.
Figure 10:
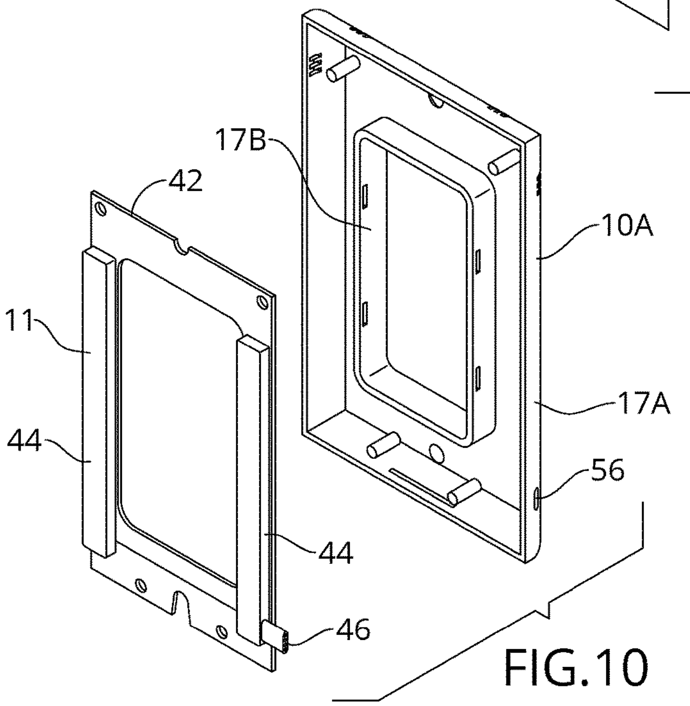
FIG. 10 is partial rear perspective exploded view of the smart wall plate of FIG. 8, showing an alternate configuration of the charger port.

In another embodiment as best depicted in FIGS. 9-10, PCB module 10B may include a PCB 42 which holds rechargeable batteries 44. In some embodiments, rechargeable batteries 44 may be directly coupled to PCB 42 without battery holding components such as battery holders 20. In certain embodiments, rechargeable batteries 44 may include a charging port 46 (e.g., USB Type-C connector). In some embodiments, charging port 46 may comprise a magnetic connector housing. In one embodiment as depicted in FIGS. 8-9, charging port 46 may be rear facing, wherein rear wall enclosure 10C may be provided with a rear-side port slot 50 for accessing charging port 46. In another embodiment as depicted in FIG. 10, charging port 46 may be side facing, wherein outer surrounding wall(s) 17A may be provided with a side port slot 56 for accessing charging port 46. In some embodiments, rechargeable batteries 44 may be capable of drawing power from the electrical box for recharging batteries 44 to increase battery lifetime and/or reduce battery replacement frequency. This may be done, for example, by modifying the electrical box for wireless charging (e.g., via the side terminals of the outlet, light switch, or PoE), or by directly plugging a USB cord between the charging port and outlet.

Figure 11:
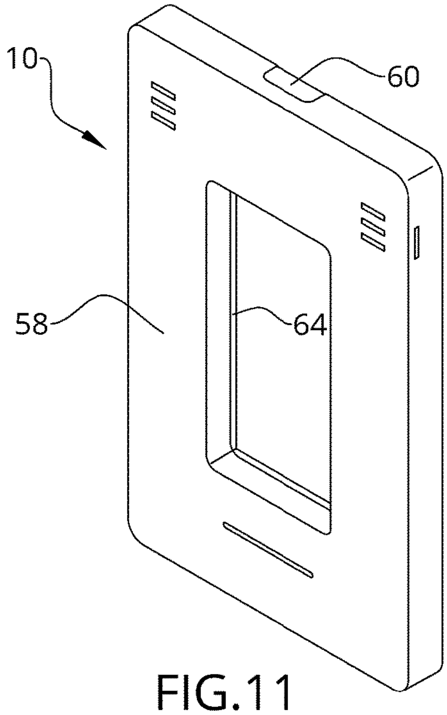
FIG. 11 is a perspective view of a battery powered smart wall plate according to an alternate embodiment.
Figure 12:
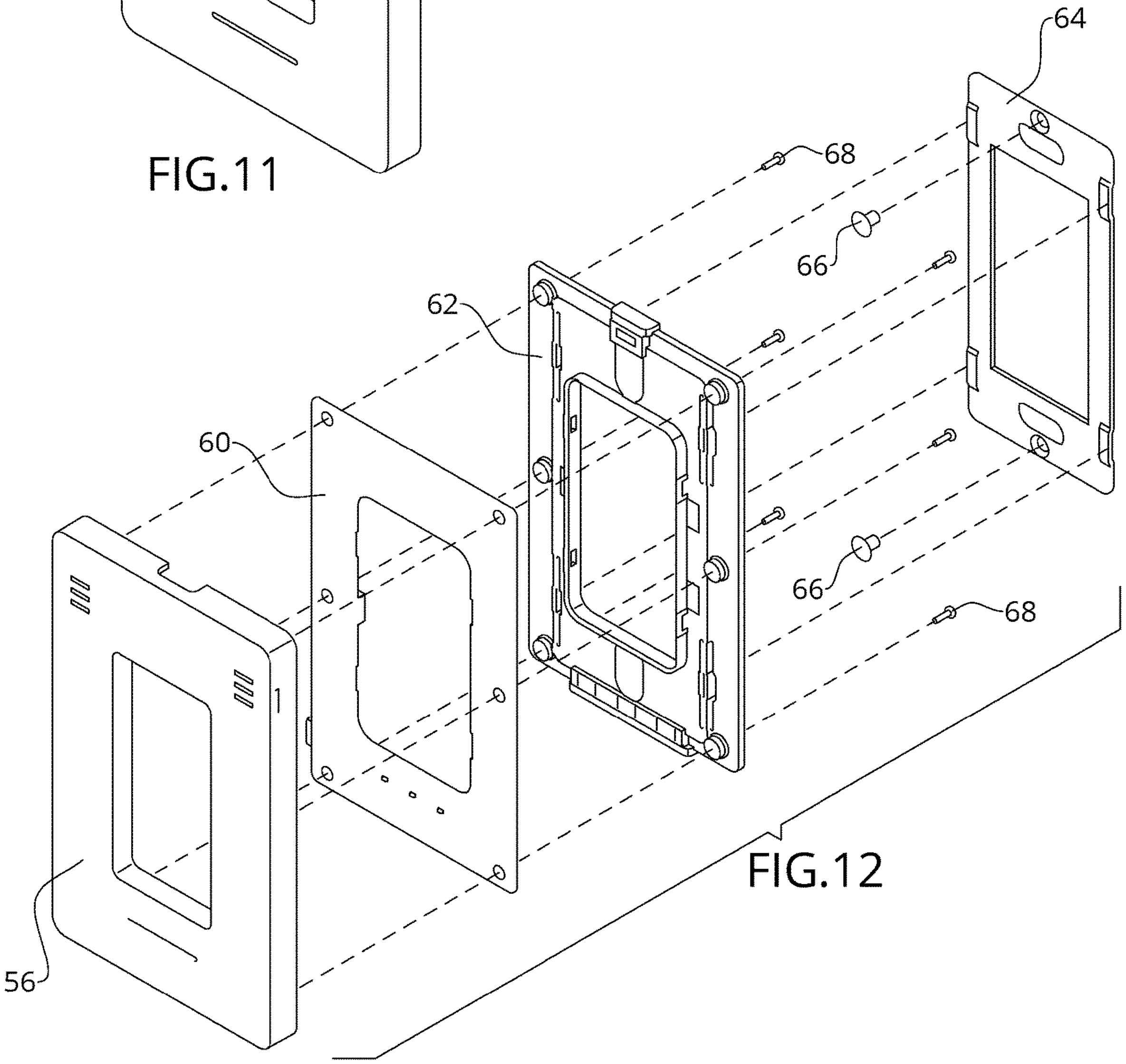
FIG. 12 is a front side exploded view of the wall plate of FIG. 11.
Figure 13:
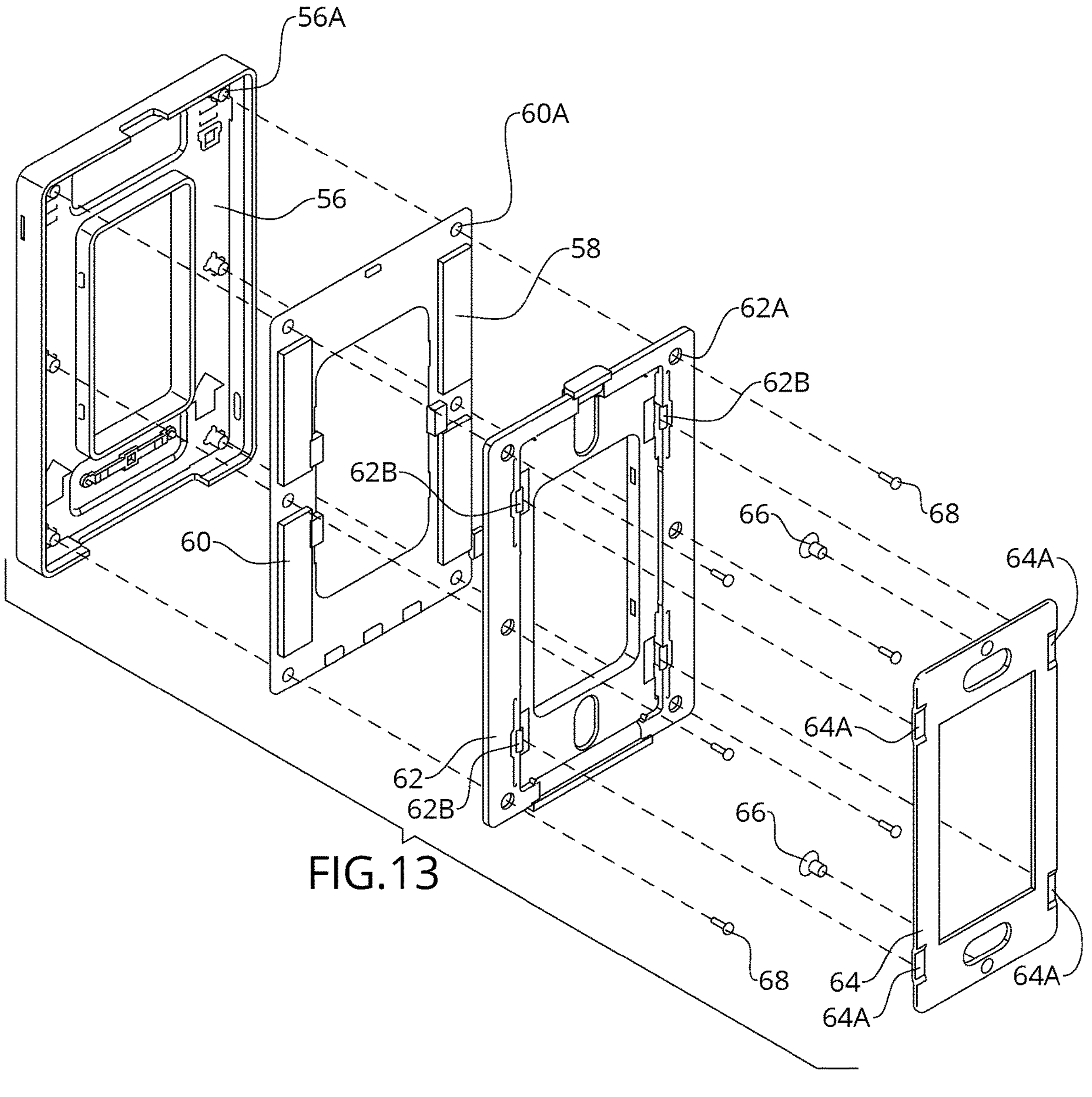
FIG. 13 is a rear side exploded view of the wall plate of FIG. 11.

In another embodiment, as depicted in FIGS. 11-13, wall plate 10 may comprise a front enclosure 56 similar to front enclosure 10A, a printed circuit board 60 similar to PCB module 10B and including batteries 58, a rear enclosure 62 similar to rear enclosure 10C, and an intermediate cover plate 64 configured to allow front enclosure 56, circuit board 60, and rear enclosure 62 to be mounted on onto a wall and/or around an in-wall unit. In embodiments, intermediate cover plate 64 may itself be mounted to the wall using screws 66, which may be engaged through holes within plate 64. Front enclosure 56, circuit board 60, and rear enclosure 62 may be attached to one another via screws 68 engaged through respective screw holes 62A, 60A, and screw slot 56A, within the three components, and the assembled components may be attached onto intermediate cover plate 64 without extraneous fastening elements such as additional screws. In certain embodiments, attachment elements such as resilient tabs 64A and corresponding slots 62B may be provided within intermediate plate 64 and rear enclosure 62, respectively, to enable the components to snap together.

As such, smart wall plate 10 may replace a regular (i.e., non-electrically functional) wall plate of any traditional (i.e., non-smart) in-wall electrical box system, e.g., outlet, light switch, dimmer, phone box, ethernet box, etc., to provide smart functionality which may be unrelated to the electrical box system itself. In some other embodiments, smart wall plate 10 may be configured to integrate with the functionality of a smart electrical box system. As smart wall plate 10 is battery powered, it may be used to replace an existing wall plate (smart or traditional) without requiring disassembly of the electrical box components. It shall be appreciated that while certain embodiments of smart wall plate 10 are designed to combine with an electrical box, smart wall plate 10 does not necessarily require an electrical box to function as it is self-powered, and can be affixed anywhere on a wall or other location (e.g., using drill holes, adhesive, etc.) in alternate embodiments.

In certain embodiments, smart wall plate 10 may be installed by removing the existing wall plate (i.e., cover plate) of an in-wall electrical box and attaching smart wall plate 10 in place of the previous wall plate. In certain cases, smart wall plate 10 may require installing batteries, or recharging its batteries. In some cases, smart wall plate 10 may require initial setup depending on the state and type of smart wall plate. Various set up procedural steps may entail pairing, provisioning, commissioning, etc., as is known.

As such, smart wall plate 10 provides a smooth installation process for replacement of a non-electrically functional wall plate to fully utilize the wall plate area for providing smart home accessory needs. The conventional wall plate location provides a convenient fixture position, which does not clutter and/or adversely affect the aesthetics of the environment. Furthermore, a technician is not needed for the installation.

It shall be appreciated that the disclosed smart wall plate 10 and system can have multiple configurations in different embodiments. It shall be appreciated that the disclosed wall plate may be used for various applications known in the art, or which may become available. In certain embodiments, smart wall plate 10 may perform functionalities such as enabling a user to see the installed environment temperature, humidity, ambient brightness, people walking, providing illumination in dark conditions etc. In a further embodiment, smart wall plate 10 may be a component of a smart building emergency system.

It shall be appreciated that the device and system described herein may comprise any alternative known materials in the field and be of any size and/or dimensions. It shall be appreciated that the device may be manufactured and assembled using any known techniques in the field.

It shall be understood that the orientation or positional relationship indicated by terms such as "upper", "lower", "front", "rear", "left", "right", "top", "bottom", "inside", "outside" is based on the orientation or positional relationship shown in the accompanying drawings, which is only for convenience and simplification of describing the disclosed subject matter, rather than indicating or implying that the indicated device or element must have a specific orientation or are constructed and operated in a specific orientation, and therefore should not be construed as a limitation of the present invention.

As used herein, the articles "a" and "an" are intended to include one or more items, and may be used interchangeably with "one or more." Where only one item is intended, the term "one" or similar language is used. Also, as used herein, the terms "has", "have", "having", "with" or the like are intended to be open-ended terms. Further, the phrase "based on" is intended to mean "based, at least in part, on" unless explicitly stated otherwise.

The constituent elements of the disclosed device and system listed herein are intended to be exemplary only, and it is not intended that this list be used to limit the device of the present application to just these elements. Persons having ordinary skill in the art relevant to the present disclosure may understand there to be equivalent elements that may be substituted within the present disclosure without changing the essential function or operation of the device. Terms such as 'approximate,' 'approximately,' 'about,' etc., as used herein indicate a deviation of within +/−10%. Relationships between the various elements of the disclosed device as described herein are presented as illustrative examples only, and not intended to limit the scope or nature of the relationships between the various elements. Persons of ordinary skill in the art may appreciate that numerous design configurations may be possible to enjoy the functional benefits of the inventive systems. Thus, given the wide variety of configurations and arrangements of embodiments of the present invention the scope of the invention is reflected by the breadth of the claims below rather than narrowed by the embodiments described above.

What is claimed is:

1. A smart wall plate, comprising:

a front enclosure;

a PCB module;

wherein the smart wall plate is configured to retain a battery for powering the PCB module, wherein the smart wall plate is configured to framingly mount around a gang unit of an in-wall electrical box, the smart wall plate including an opening through which the gang unit is exposed, the smart wall plate, further comprising a rechargeable battery attached to a printed circuit board of the PCB module, the rechargeable battery including a charging port.

2. The smart wall plate of claim 1, further comprising a rear enclosure, wherein the PCB module is disposed between the front enclosure and the rear enclosure.

3. The smart wall plate of claim 1, wherein front enclosure includes holes for receiving fasteners configured to attach the smart wall plate to a wall surrounding the in-wall electrical box.

4. The smart wall plate of claim 1, further comprising a battery holder attached to a printed circuit board of the PCB module.

5. The smart wall plate of claim 4, wherein the battery holder is configured to retain a disk battery.

6. The smart wall plate of claim 1, wherein the charging port includes a magnetic housing.

7. The smart wall plate of claim 1, wherein the charging port is exposed through a slot within an outer side wall of the front enclosure.

8. The smart wall plate of claim 1, further comprising a rear enclosure, wherein the printed circuit board module is disposed between the front enclosure and the rear enclosure, and wherein the charging port is exposed through a slot within the front or rear enclosure.

9. The smart wall plate of claim 1, wherein the smart wall plate is configured to replace an existing wall plate of the in-wall electrical box, the electrical box including one or more gangs.

10. A smart wall plate, comprising:

a front enclosure;

a PCB module;

wherein the smart wall plate is configured to retain a battery for powering the PCB module, wherein the smart wall plate is configured to framingly mount around a gang unit of an in-wall electrical box, the smart wall plate including an opening through which the gang unit is exposed, the smart wall plate, further comprising an intermediate cover plate and a rear enclosure, the intermediate cover plate including holes for receiving fasteners configured to attach the intermediate cover plate to a wall surrounding the in-wall electrical box and/or the in-wall unit, wherein the PCB module is disposed between the front enclosure and the rear enclosure, and wherein the front enclosure, the PCB module, and the rear enclosure are configured to attach to the intermediate cover plate without extraneous fastening elements.

11. The smart wall plate of claim 10, wherein the front enclosure, the PCB module, and the rear enclosure are configured to snap fit to the intermediate cover plate.

* * * * *